United States Patent
Crocker et al.

(10) Patent No.: US 7,273,090 B2
(45) Date of Patent: Sep. 25, 2007

(54) SYSTEMS FOR INTEGRATED COLD PLATE AND HEAT SPREADER

(75) Inventors: Michael T. Crocker, Portland, OR (US); Daniel P. Carter, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 105 days.

(21) Appl. No.: 11/170,425

(22) Filed: Jun. 29, 2005

(65) Prior Publication Data

US 2007/0000647 A1    Jan. 4, 2007

(51) Int. Cl.
*F28F 7/00* (2006.01)
(52) U.S. Cl. ............................ 165/104.33; 165/185
(58) Field of Classification Search ........... 165/104.33, 165/80.1–80.5, 185
See application file for complete search history.

(56) References Cited

U.S. PATENT DOCUMENTS

| | | | | |
|---|---|---|---|---|
| 4,682,651 A | * | 7/1987 | Gabuzda | 165/80.3 |
| 5,019,880 A | * | 5/1991 | Higgins, III. | 165/80.3 |
| 6,064,572 A | * | 5/2000 | Remsburg | 165/80.4 |
| 6,408,937 B1 | * | 6/2002 | Roy | 165/104.33 |
| 6,487,873 B2 | * | 12/2002 | Kyees | 165/168 |
| 6,983,789 B2 | * | 1/2006 | Jenkins et al. | 165/80.3 |
| 7,104,312 B2 | * | 9/2006 | Goodson et al. | 165/80.4 |
| 2003/0200762 A1 | | 10/2003 | Nakano et al. | |
| 2004/0052049 A1 | * | 3/2004 | Wu et al. | 165/104.33 |
| 2004/0074630 A1 | | 4/2004 | Sen et al. | |
| 2004/0104010 A1 | * | 6/2004 | Kenny et al. | 165/80.4 |
| 2005/0047085 A1 | | 3/2005 | Mankaruse et al. | |
| 2005/0061486 A1 | * | 3/2005 | Yang | 165/104.33 |

FOREIGN PATENT DOCUMENTS

| | | |
|---|---|---|
| DE | 202 05 305 U1 | 8/2002 |
| JP | 10 227585 A | 8/1998 |

OTHER PUBLICATIONS

"PCT International Search Report of the International Searching Authority", mailed May 31, 2007 for PCT/US2006/026369, 5pgs.

* cited by examiner

*Primary Examiner*—Teresa J. Walberg
(74) *Attorney, Agent, or Firm*—Buckley, Maschoff & Talwalkar LLC

(57) ABSTRACT

According to some embodiments, systems for an integrated cold plate and heat exchanger may be provided. In some embodiments, a device may comprise a cold plate to transfer heat to a fluid and a heat spreader integral with the cold plate, the heat spreader to accept heat from an electronic device. In some embodiments, the heat spreader and the cold plate are monolithic.

19 Claims, 5 Drawing Sheets

SYSTEMS FOR INTEGRATED COLD PLATE AND HEAT SPREADER

BACKGROUND

Electrical devices, such as computers, are comprised of multiple electrical components (e.g., processors, voltage regulators, and/or memory devices). Electrical components typically dissipate unused electrical energy as heat, which may damage the electrical components and/or their surroundings (e.g., other electrical components and/or structural devices such as casings, housings, and/or electrical interconnects). Various means, such as heat sinks and heat pipes, have been utilized to control and/or remove heat from electrical components and their surroundings.

As electrical devices, such as personal computer (PC) devices and even computer servers, are reduced in size however, space and cost constraints become limiting design factors. Typical heat mitigation devices, for example, take up considerable amounts of room within electrical devices and/or include expensive components. As electrical devices increase in processing speed and power, their components will generate even more heat that must be removed. Typical heat mitigation devices may not be suitable for removing adequate amounts of heat from electrical components, particularly where space and cost are concerns.

DETAILED DESCRIPTION

Figure 1:
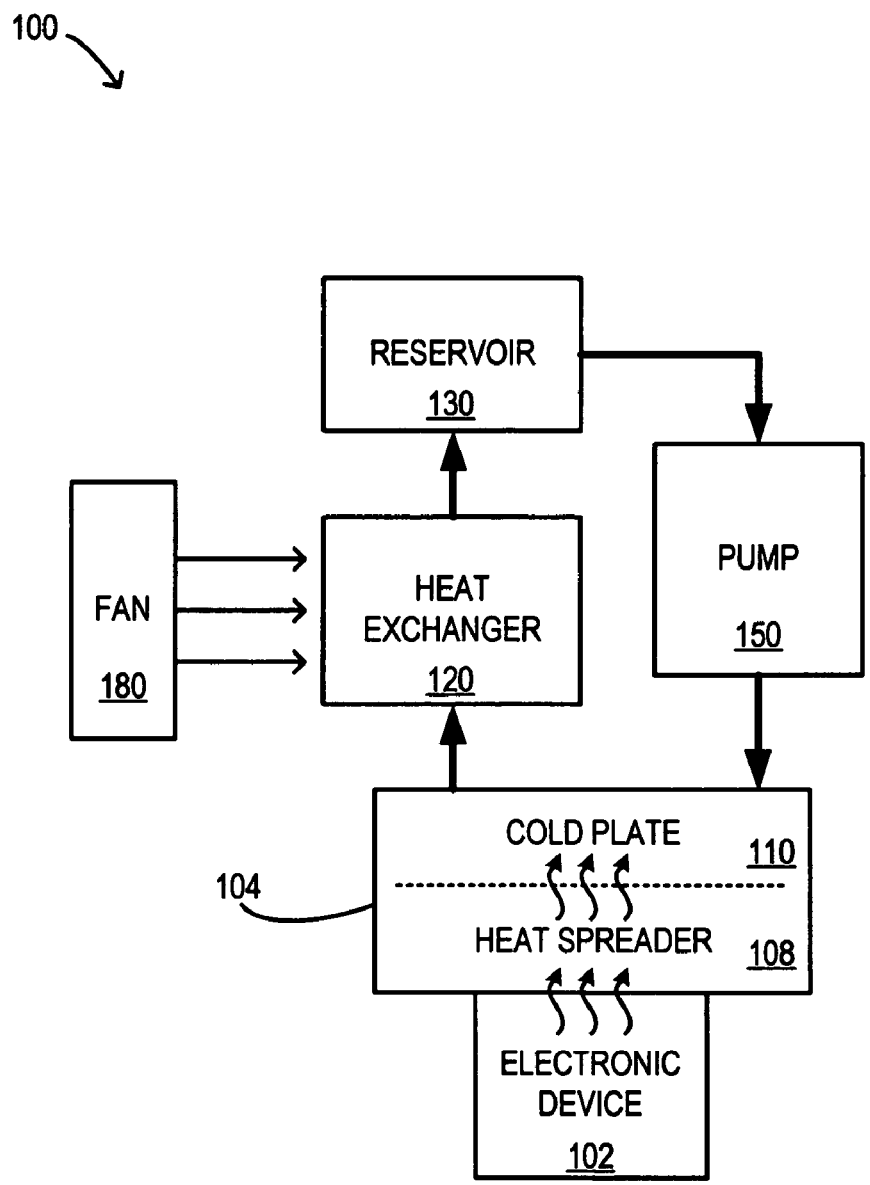
FIG. 1 is a block diagram of a system according to some embodiments.
Figure 2A:
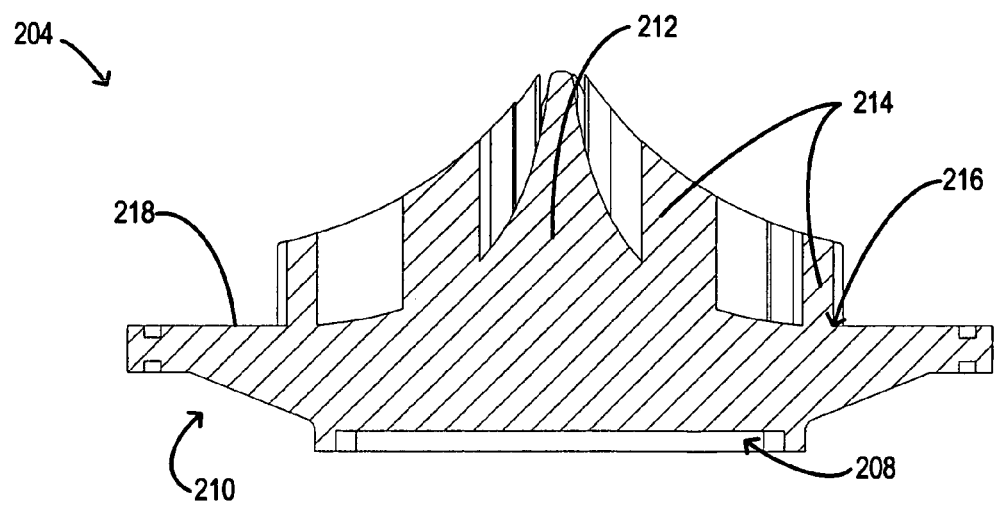
FIG. 2A is a cross-sectional diagram of a system according to some embodiments.
Figure 2B:
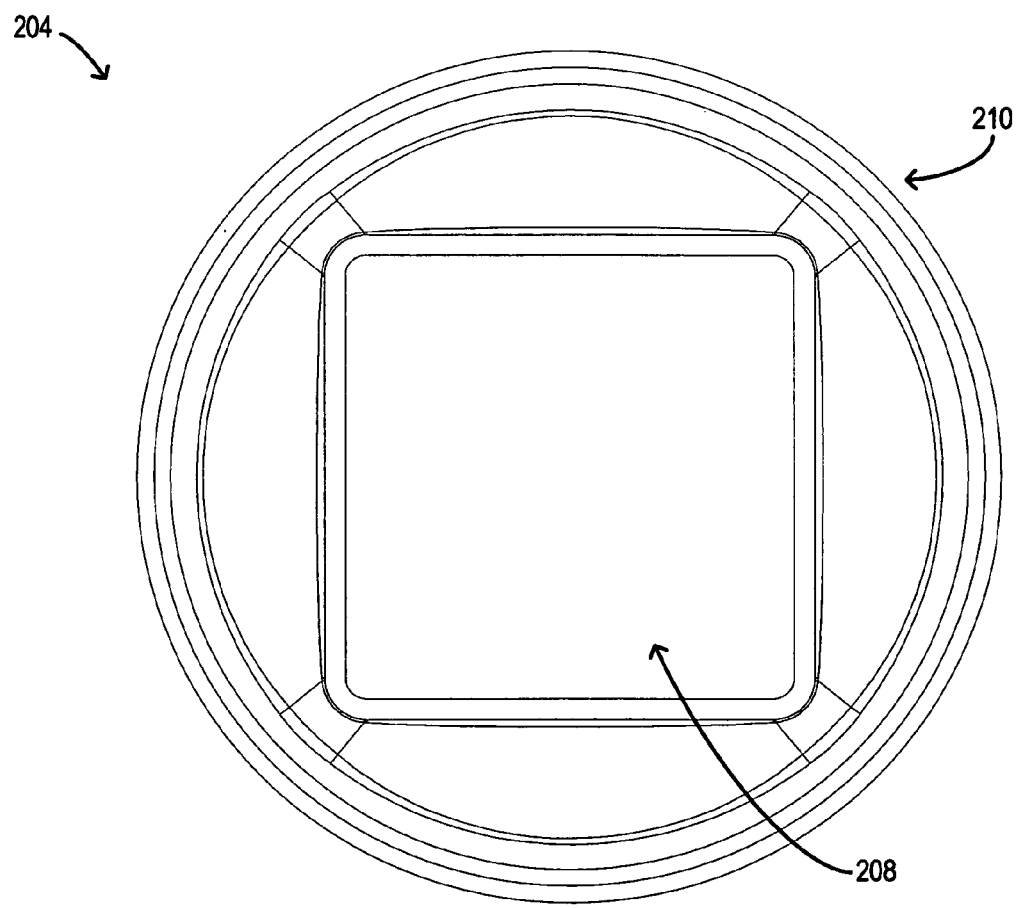
FIG. 2B is a bottom view of a system according to some embodiments.
Figure 2C:
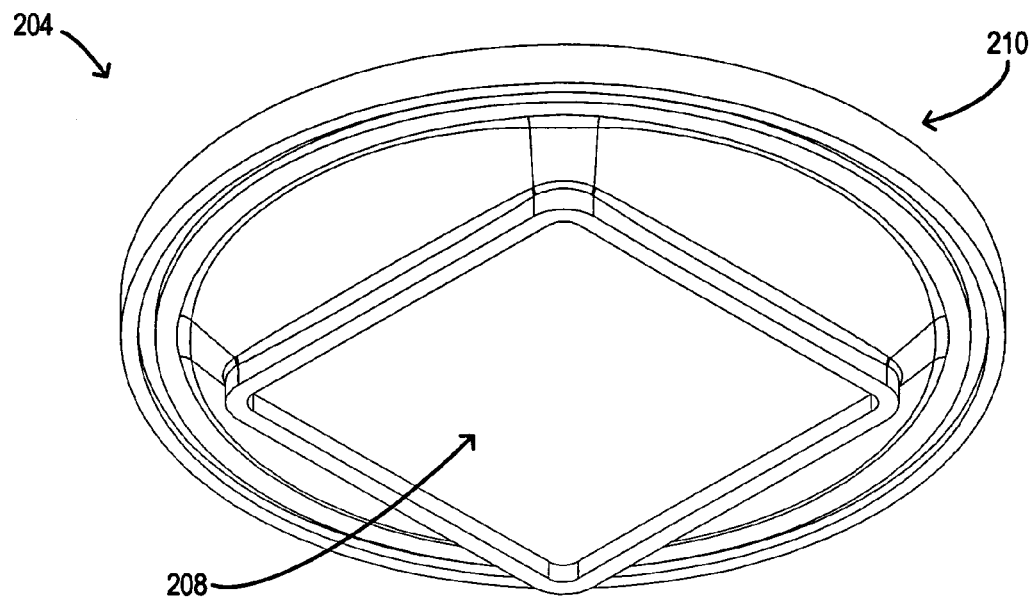
FIG. 2C is a perspective bottom view of a system according to some embodiments.
Figure 2D:
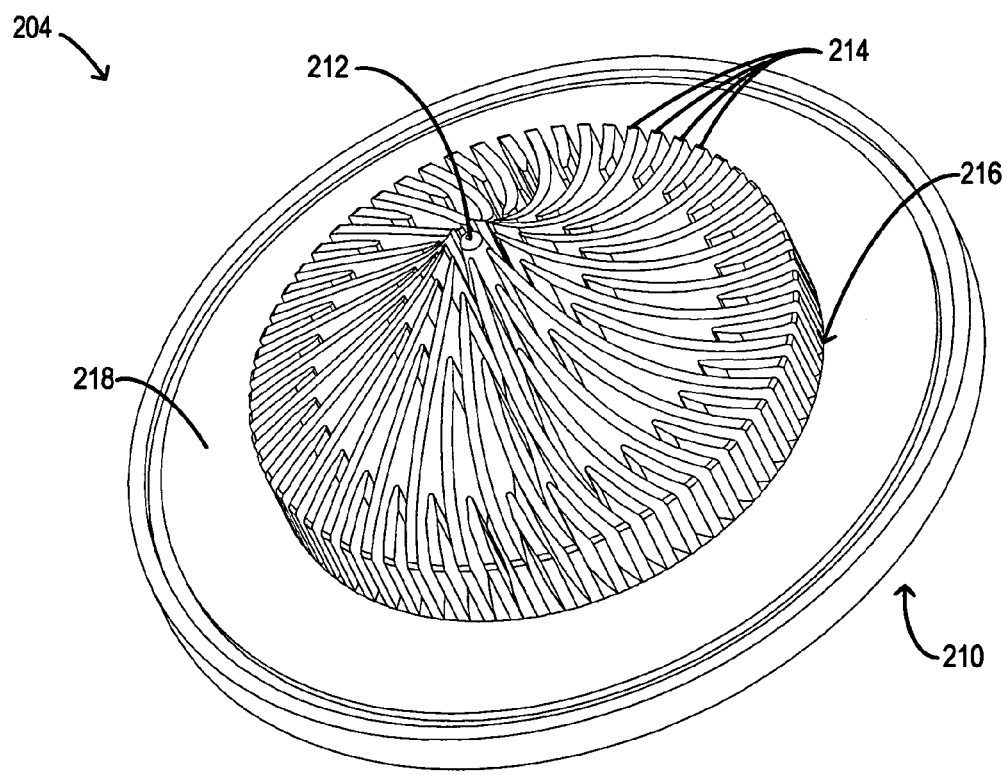
FIG. 2D is a perspective top view of a system according to some embodiments.
Figure 2E:
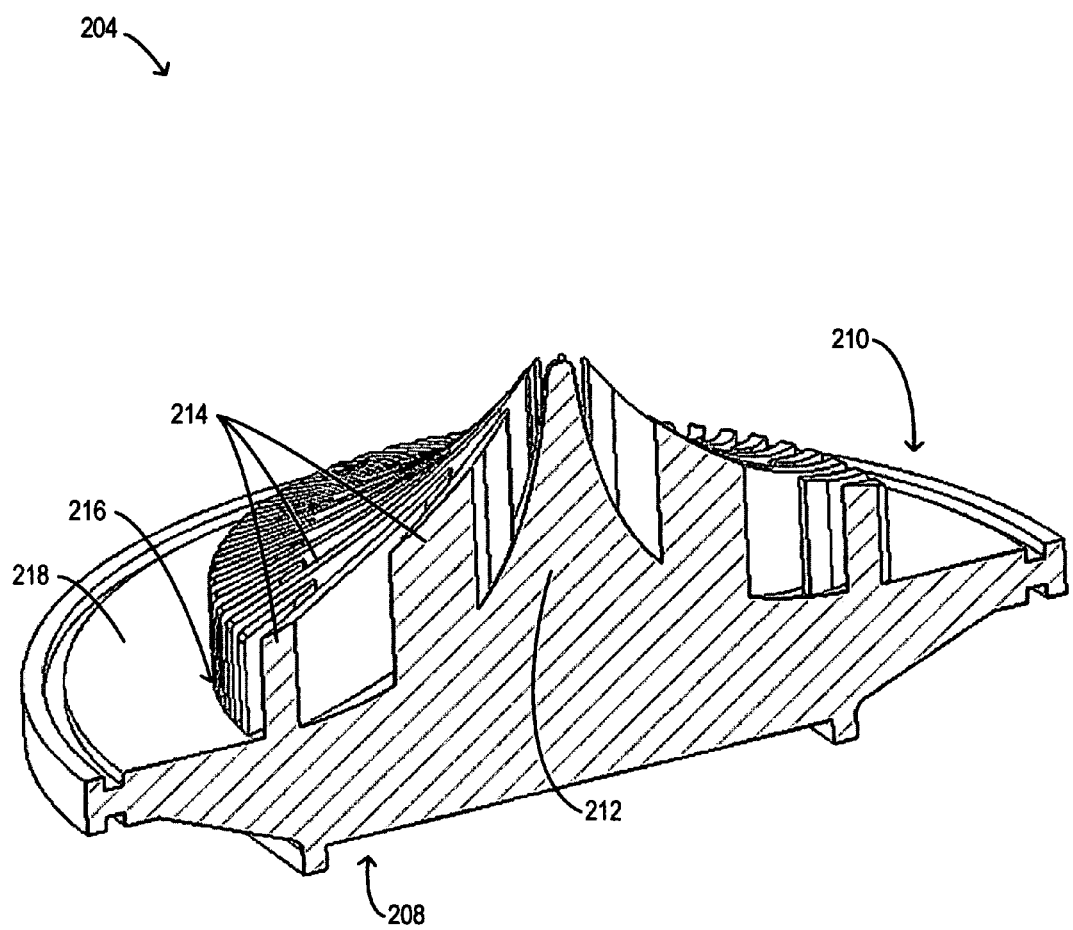
FIG. 2E is a perspective cross-sectional diagram of a system according to some embodiments.

Referring first to FIG. 1, a block diagram of a system 100 according to some embodiments is shown. The various systems described herein are depicted for use in explanation, but not limitation, of described embodiments. Different types, layouts, quantities, and configurations of any of the systems described herein may be used without deviating from the scope of some embodiments. Fewer or more components than are shown in relation to the systems described herein may be utilized without deviating from some embodiments.

The system 100 may comprise, for example, an electronic device 102 (such as a processor, memory device, a voltage regulator, etc.) And/or a device 104. The device 104 may, for example, comprise a heat spreader 108 and/or a cold plate 110. The device 104 may, according to some embodiments, be or include a device that integrates the heat spreader 108 and the cold plate 110. In some embodiments, the system 100 may also or alternatively comprise a heat exchanger 120, a reservoir 130, a pump 150, and/or a fan 180. In some embodiments, the electronic device 102 may generate heat and/or may transfer heat to the device 104. The electronic device 102 may, for example, transfer heat to the heat spreader 108 (e.g., the heat spreader 108 portion of the device 104). The heat spreader 108 may, for example, be coupled to the electronic device 102 to accept and/or remove heat from the electronic device 102. In some embodiments, the heat spreader 108 may accept the heat from the electronic device 102 and transfer the heat to the cold plate 110 (e.g., the cold plate 110 portion of the device 104). Heat may travel through conduction, for example, from the electronic device 102, through the heat spreader 108, and to the cold plate 110 (e.g., as depicted via the wavy lines in FIG. 1). The heat spreader 108 may be or include, according to some embodiments, an integrated heat spreader (IHS) device configured to distribute and/or spread the heat received from the electronic device 102 to the cold plate 110.

In some embodiments, the cold plate 110 (and/or the device 104) may transfer heat to the heat exchanger 120. The heat exchanger 120 may, for example, be a heat sink and/or radiator configured to expel and/or dissipate heat. In the case that the heat exchanger 120 comprises fins (not shown in FIG. 1) for dissipating heat, for example, the fan 180 may facilitate the removal and/or dissipation of heat from the heat exchanger 120. The fan 180 may, in some embodiments, direct air toward the heat exchanger 120 (and/or any fins thereof) to facilitate forced convection to remove heat from the heat exchanger 120. In some embodiments, the fan 180 may be disposed, configured, and/or otherwise may be operable to direct air toward the heat exchanger 120 from one or more of a variety of directions.

The system 100 may also or alternatively comprise the pump 150. The pump 150 may, according to some embodiments, circulate a fluid within the system 100. For example, the heat transferred by the electronic device 102 to the device 104, the heat spreader 108, and/or the cold plate 110 may be directed to and/or transferred to (e.g., conducted to) a fluid (such as water and/or propylene glycol) that circulates through and/or over the device 104 and/or cold plate 110. The heated fluid may then, for example, be forced by the pump 150 to the heat exchanger 120 to transfer heat to the heat exchanger 120 and/or to otherwise dissipate the heat within the fluid. The heat exchanger 120 may, for example, remove heat from the fluid. The cooled fluid (e.g., cooled relative to the heated fluid and/or the cold plate 110) may then proceed to the reservoir 130. The reservoir 130 may, for example, store a quantity of the fluid for use in the system 100. The fluid may then, for example, circulate through the pump 150 (e.g., a centrifugal pump) and/or be drawn from the reservoir 130 by the pump 150. The fluid may then proceed (and/or be directed) back to the device 104 and/or the cold plate 110 to remove more heat from the device 104 and/or the cold plate 110 (e.g., by allowing heat to transfer from the cold plate 110 into the cooled fluid).

Integrating the heat spreader 108 with the cold plate 110 (e.g., as the device 104), may provide advantages over previous cooling solutions. Typical cooling solutions may, for example, include a cold plate attached to an integrated heat spreader associated with a processor and may utilize a thermal grease and/or other thermal interface material (TIM) between the two components (e.g., to facilitate heat transfer and/or attachment). According to some embodiments, such as in the case that the cold plate 110 and the heat spreader 108 are integrated (e.g., comprising the single and/or monolithic device 104), the efficiency and/or effectiveness of the system 100 may be increased and/or the cost of the system 100 may be decreased. The integration may, for example, reduce thermal transfer inefficiencies (and/or cost) associated with TIM utilization and/or may otherwise increase heat transfer from the electronic device 102. According to some embodiments, the integration may eliminate a potential point of failure by eliminating a coupling interface (i.e., between the cold plate 110 and the heat spreader 108). The integration may also or alternatively reduce costs (e.g., manufacturing and/or assembly costs) by reducing the total number of independent components within the system 100.

Turning in more detail to FIG. 2A, FIG. 2B, FIG. 2C, FIG. 2D, and FIG. 2E, a cross-sectional diagram of a device 204, a bottom view of the device 204, a perspective bottom view of the device 204, a perspective top view of the device 204, and a perspective cross-sectional view of the device 204 according to some embodiments are shown, respectively. In some embodiments, the device 204 may be similar to the system 100 described in conjunction with FIG. 1 and/or with any component of the system 100. The device 204 may, for example, be associated with the removal, transfer, and/or dissipation (e.g., radiation) of heat. According to some embodiments, the device 204 may be similar to the device 104 described in conjunction with FIG. 1. In some embodiments, fewer or more components than are shown in FIG. 2A, FIG. 2B, FIG. 2C, FIG. 2D, and/or FIG. 2E may be included in the device 204.

In some embodiments, the device 204 may comprise a heat spreader 208 and/or a cold plate 210 (and/or heat spreader and cold plate portions). The cold plate 210 may, for example, comprise a center portion 212, fins 214, a radius 216, and/or a surface 218. In some embodiments, the heat spreader 208 and/or the system 200 may be coupled to an electronic device and/or electrical component (not shown in FIG. 2A, FIG. 2B, FIG. 2C, FIG. 2D, or FIG. 2E). The heat spreader 208 may, for example, receive heat from the electronic device (e.g., coupled to the underside of the heat spreader 208) and transfer the heat to the cold plate 210. In some embodiments, a fluid may also or alternatively be passed over and/or through the cold plate 210 to remove heat from the cold plate 210.

In some embodiments, the cold plate 210 and the heat spreader 208 may be integrated (e.g., into a single and/or monolithic device 204 as shown). The heat spreader 208 and the cold plate 210 may, for example, be or include portions of the device 204. According to some embodiments, the heat spreader 208 may comprise a substantially rectangular and/or or square-shaped portion of the device 204 and/or of the cold plate 210. As shown, for example, the heat spreader 208 may comprise a square-shaped portion of an otherwise substantially circularly-shaped cold plate 210 and/or device 204. In some embodiments, the heat spreader 208 may be shaped and/or configured to couple to an electronic device (such as the electronic device 102). The heat spreader 208 may, for example, be configured to at least partially envelope and/or become seated upon a processor (not shown). In the case that the heat spreader 208 comprises an indentation within the device 204 (e.g., on the bottom portion of the cold plate 210 and/or the device 204), for example, the device 204 may be configured to seat upon and/or otherwise couple to an electronic device to remove and/or accept heat there from.

The cold plate 210 may, according to some embodiments, be or include a disk and/or other circular configuration. As shown, for example, the cold plate 210 may be a finned-disk (e.g., comprising the fins 214). In some embodiments, the cold plate 210 may be comprised of copper and/or another thermally conductive material. The cold plate 210 may, for example, be a finned copper disk. According to some embodiments, the cold plate 210 may be manufactured using a metal injection molding (MIM) process or various forging techniques. The cold plate 210 may, in some embodiments, also or alternatively be shaped and/or otherwise configured to fit inside and/or otherwise be integrated with a pump (such as the pump 150). In some embodiments, the heat spreader 208 may also or alternatively be comprised of copper and/or another thermally conductive material. The heat spreader 208 may, for example, comprise a stamped, forged, milled, molded, and/or otherwise manufactured portion of the cold plate 210 and/or of the device 204. In other words, the heat spreader 208 and the cold plate 210 may be formed and/or defined from a single, uniform, monolithic, and/or otherwise integrated or one-piece object and/or material (such as a single MIM and/or forged copper device 204).

In some embodiments, the central portion 212 of the cold plate 210 may be the hottest portion of the cold plate 210 (e.g., the temperature of the cold plate 210 may decrease as the radius increases). This may be due at least in part, for example, to the concentration of heat from the electronic device and/or from the heat spreader 208 toward the central portion 212 of the cold plate 210. In some embodiments, the heat spreader 208 may be configured to promote and/or facilitate such heat distribution. The heat spreader 208 may, for example, be configured to provide heat to the cold plate 210 in a manner consistent with the configuration of the cold plate 210. The fins 214 of the cold plate 210 may, for example be configured to efficiently remove and/or dissipate heat from the cold plate 210 and/or from the device 204. In some embodiments, the fins 214 may (as shown) be taller near the central portion 212 of the cold plate 210 and decrease in height, size, and/or surface area as the radius of the cold plate 210 increases. The fins 214 may also or alternatively increase in number (e.g., also as shown, and most easily seen in FIG. 2D and FIG. 2E) as the radius of the cold plate 210 and/or device 204 increases. The number and/or size of the fins 214 may be designed and/or controlled, according to some embodiments, to manage the cross-sectional area of the cold plate 210 and/or the device 204 as a function of the radius of the cold plate 210 (and/or the system 200). The ratio may be maintained at a substantially constant value, for example, to increase the efficiency with which the cold plate 210 and/or device 204 may transfer heat to the fluid.

In some embodiments, such as in the case that the fluid is utilized to cool and/or remove heat from the cold plate 210, the fluid may be directed toward the central portion 212 of the cold plate 210. The fins 214 of the cold plate 210 may, according to some embodiments, be taller near the central portion 212 of the cold plate, and may decrease in height and/or size as the radius of the cold plate 210 and/or device 204 increases. In such a manner, for example, the fluid may be in greater contact with the hottest portions (e.g., the central portion 212) of the cold plate 210, increasing the efficiency of the heat transfer from the cold plate 210 to the fluid. According to some embodiments, the fins 214 and/or the central portion 212 of the cold plate 210 may be configured to direct the fluid in a radial fashion outward from the central portion 212 of the cold plate 210 to the extremities and/or extents of the cold plate 210 and/or device 204. In such a manner, for example, a cross-flow of heat exchange may be accomplished by directing the coldest fluid over the hottest portions (e.g., the central portion 212) of the cold plate 212, while the increasingly heated fluid travels over increasingly cooler portions of the cold plate 210. This cross-flow heat exchange may, according to some embodiments, achieve high efficiencies of heat transfer between the cold plate 210 and the fluid.

The fins 214 of the cold plate 210 may also or alternatively be curved. The orientation of the fins 214 may, according to some embodiments, cause the fluid directed toward the cold plate 210 to be directed in a radial fashion toward the radius 216 of the cold plate 210. In some embodiments, the cold plate 210 and/or a portion thereof may be at least partially disposed within a pump (e.g., the pump 150). The fins 214 of the cold plate 210 may, according to some embodiments, be disposed within a pump housing (e.g., and exposed to the fluid flowing within the pump). The fins 214 may also or alternatively, for example, terminate at the radius 216 so that an impeller of the pump may rotate around the fins 214. The surface 218 situated between the radius 216 and the edge of the cold plate 210 may, for example, be used to rotate the vanes of an impeller around the fins 214. The curvature of the fins 214 may, according to some embodiments, direct the fluid toward the vanes of the impeller, increasing the efficiency of the fluid flow through the impeller. The cold plate 210 may, for example, function as a flow inducer for the impeller. In some embodiments, the curved nature of the fins 214 may also or alternatively increase the efficiency of heat transfer from the fins 214 to the fluid. The fluid may be scrubbed across the fins 214, for example, as the fluid is forced to change direction by the curved fins 214.

In some embodiments, the device 204 may provide many advantages over typical cooling solutions. The integration of the cold plate 210 and the heat spreader 208 into the device 204 may, for example, reduce costs, increase heat transfer efficiencies, and/or increase the reliability of the device 204. The integration of the cold plate 210 and the heat spreader 208 may, according to some embodiments, reduce costs at least by reducing the number of individual cooling system components that must be coupled and/or interfaced. A single combined cold plate 210 and heat spreader 208 device 204 may, for example, reduce the complexity of the cooling solution. Typical stand-alone heat spreaders and/or IHS devices may, for example, be more costly to produce, mill, machine, and/or polish than an integrated version according to some embodiments described herein (e.g., the device 204). The heat spreader 208 integrated with the cold plate 210 may, for example, allow a single forged device 204 to include most or all of the features of the cold plate 210 and the heat spreader 208, and may, for example, only require flash clean up and/or other minimal finishing of the heat spreader 208 surface. In some embodiments, the integrated cold plate 210 and heat spreader 208 may also or alternatively allow and/or facilitate the combined device 204 to be integrated into a pump housing. The cold plate 210 may be at least partially disposed within the pump housing, for example, while the heat spreader 208 (and/or heat spreader portion) of the device 204 may be at least partially disposed outside of the pump housing.

Figure 3:
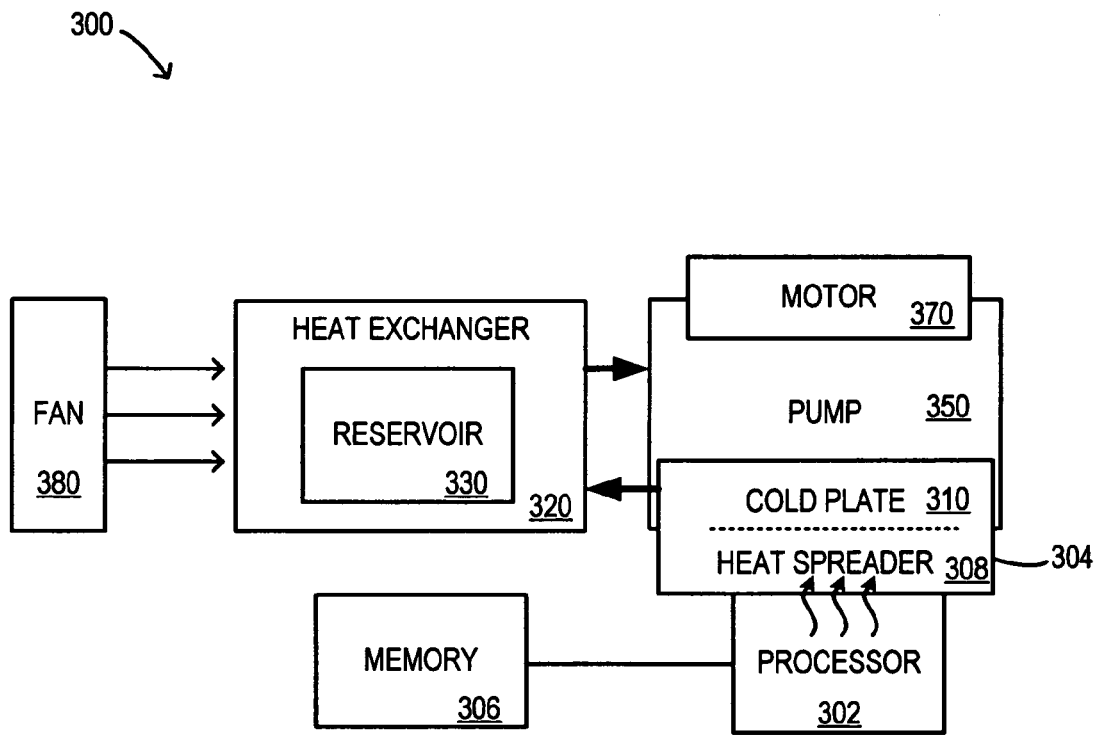
FIG. 3 is a block diagram of a system according to some embodiments.

Turning to FIG. 3, a block diagram of a system 300 according to some embodiments is shown. In some embodiments, the system 300 may be similar to the system 100 and/or the device 204 described in conjunction with any of FIG. 1, FIG. 2A, FIG. 2B, FIG. 2C, FIG. 2D, and/or FIG. 2E. The system 300 may comprise, for example, a processor 302, a device 304, a memory 306, a heat spreader 308, a cold plate 310, a heat exchanger 320, a reservoir 330, a pump 350, a motor 370, and/or a fan 380. According to some embodiments, the components 302, 304, 308, 310, 320, 330, 350, 380 of the system 300 may be similar in configuration and/or functionality to the similarly-named components described in conjunction with any of FIG. 1, FIG. 2A, FIG. 2B, FIG. 2C, FIG. 2D, and/or FIG. 2E. In some embodiments, fewer or more components than are shown in FIG. 3 may be included in the system 300.

The processor 302 may be or include any number of processors, which may be any type or configuration of processor, microprocessor, and/or micro-engine that is or becomes known or available. In some embodiments, other electronic and/or electrical devices may be utilized in place of or in addition to the processor 302. The processor 302 may, for example, be or include any device, object, and/or component that generates, stores, and/or requires removal of heat. According to some embodiments, the processor 302 may be an XScale® Processor such as an Intel® PA270 XScale® processor. The memory 306 may be or include, according to some embodiments, one or more magnetic storage devices, such as hard disks, one or more optical storage devices, and/or solid state storage. The memory 306 may store, for example, applications, programs, procedures, and/or modules that store instructions to be executed by the processor 302. The memory 306 may comprise, according to some embodiments, any type of memory for storing data, such as a single data rate random access memory (SDR-RAM), a double data rate random access memory (DDR-RAM), or a programmable read only memory (PROM).

In some embodiments, the device 304 may comprise a cold plate 310 integrated with the heat spreader 308. The heat spreader 308 (and/or the heat spreader portion of the device 304) may, for example, remove and/or receive heat (e.g., via conduction) from the processor 302 (e.g., represented by the wavy lines in FIG. 3) and/or may transfer heat to the cold plate 310 (and/or the cold plate portion of the device 304). According to some embodiments, such as shown in FIG. 3 for example, the cold plate 310 (and/or the device 304) may also or alternatively be integrated with the pump 350. The cold plate 310 may, for example, transfer heat to a fluid in the pump 350 and/or facilitate the flow of the fluid within the pump 350 as described herein. According to some embodiments, the cold plate 310 portion of the integrated device 304 may, for example, be disposed within the pump while the heat spreader 308 portion of the integrated device 304 may be disposed outside of the pump.

In some embodiments, the motor 370 may also or alternatively be integrated with the pump 350. The motor 370 may, for example, include components disposed within the pump 350 and/or components disposed outside of the pump 350. In some embodiments, the motor 370 may power the pump 350 to direct the fluid (e.g., the heated fluid) to the heat exchanger 320. The heat exchanger 320 may then, for example, transfer and/or receive heat from the fluid and dissipate and/or remove the heat from and/or within the system 300. The fan 380 may, in some embodiments, facilitate the removal and/or dissipation of heat by blowing air toward the heat exchanger 320. According to some embodiments, the reservoir 330 to store the fluid (and/or a portion thereof) may also or alternatively be integrated with the pump 350. The fluid (e.g., the cooled fluid) may, for example, be directed from the heat exchanger 320 into the reservoir 330 which may, for example, be hydraulically and/or physically coupled to the pump 350. According to some embodiments, the cooled fluid may be sent back to the cold plate 310 and/or the integrated device 304 to continue the cooling cycle.

In some embodiments, any or all of the cooling components 302, 304, 308, 310, 320, 330, 350, 370, 380 may be or include components similar to those described herein. According to some embodiments, one or all of the cooling components 304, 308, 310, 320, 330, 350, 370, 380 may also or alternatively comprise one or more conventional devices to perform the required functionality of the particular component. As an example, the heat exchanger 320 may, in some embodiments, be a typical heat sink and/or heat pipe. The pump 350 may also or alternatively, for example, be a typical centrifugal pump powered by a standard DC motor (e.g., coupled by a shaft to the pump 350).

The several embodiments described herein are solely for the purpose of illustration. Other embodiments may be practiced with modifications and alterations limited only by the claims.

What is claimed is:

1. An apparatus comprising:
   an electronic device comprising a top and one or more sides;
   a cold plate to transfer heat to a fluid; and
   a heat spreader integral with the cold plate, the heat spreader to accept heat from an electronic device,
   wherein the heat spreader is coupled to the top and to at least one of the one or more sides of the electronic device.

2. The apparatus of claim 1, wherein the heat spreader is at least one of substantially rectangular or substantially square in shape.

3. The apparatus of claim 1, wherein the cold plate is substantially circular in shape.

4. The apparatus of claim 2, further comprising a plurality of fins coupled to the cold plate, wherein the plurality of fins extend from points along a radius of the cold plate toward the center of the cold plate.

5. The apparatus of claim 4, wherein the plurality of fins increase in height as they extend toward the center of the cold plate.

6. The apparatus of claim 4, wherein the plurality of fins are substantially uniform in height as they extend toward the center of the cold plate.

7. The apparatus of claim 4, wherein the number of the plurality of fins increases from the center of the cold plate to the radius of the cold plate.

8. The apparatus of claim 1, wherein the heat spreader and the cold plate are monolithic.

9. The apparatus of claim 1, wherein the cold plate is at least partially disposed within a pump housing and wherein the heat spreader is at least partially disposed outside of the pump housing.

10. A system, comprising:
    a processor, comprising a top and one or more sides;
    a double data rate memory coupled to the processor;
    a device comprising:
      a cold plate to transfer heat to a fluid; and
      a heat spreader integral to the cold plate, the heat spreader coupled to accept heat from the processor, wherein the heat spreader is coupled to the top and to at least one of the one or more sides of the processor;
    a heat exchanger to remove heat from the fluid; and
    a pump coupled at least to move the fluid from the cold plate to the heat exchanger.

11. The system of claim 10, wherein the cold plate is at least partially disposed within a housing of the pump.

12. The system of claim 10, wherein the heat spreader is at least partially disposed outside of the housing of the pump.

13. The system of claim 10, wherein the heat spreader is at least one of substantially rectangular or substantially square in shape.

14. The system of claim 10, wherein the cold plate is substantially circular in shape.

15. The system of claim 10, wherein the device further comprises a plurality of fins coupled to the cold plate, wherein the plurality of fins extend from points along a radius of the cold plate toward the center of the cold plate.

16. The system of claim 10, wherein the heat spreader and the cold plate are monolithic.

17. A method, comprising:
    forming a cold plate to transfer heat to a fluid; and
    integrating a heat spreader with the cold plate, the heat spreader to accept heat from an electronic device, wherein the heat spreader and the cold plate are monolithic, and wherein the heat spreader is coupled to a top and to at least one of one or more sides of the electronic device.

18. The method of claim 17, wherein the forming and integrating comprises:
    injecting a metal into a mold that defines extents of the monolithic heat spreader and cold plate combination.

19. The method of claim 17, further comprising:
    coupling the integrated monolithic heat spreader and cold plate combination to at least one of the electronic device or a pump housing.

* * * * *